(12) United States Patent
Fedorikhin et al.

(10) Patent No.: US 12,082,360 B2
(45) Date of Patent: Sep. 3, 2024

(54) RESILIENT PRINTED CIRCUIT BOARD RETENTION ARRANGEMENT

(71) Applicant: Garrett Transportation I Inc, Torrance, CA (US)

(72) Inventors: Valeriy Fedorikhin, Redondo Beach, CA (US); Adam Robinson, Los Angeles, CA (US); Ali Mohammadpour, Redondo Beach, CA (US); Andrew Love, Marina Del Rey, CA (US)

(73) Assignee: GARRETT TRANSPORTATION I INC, Torrance, CA (US)

(*) Notice: Subject to any disclaimer, the term of this patent is extended or adjusted under 35 U.S.C. 154(b) by 415 days.

(21) Appl. No.: 17/447,312

(22) Filed: Sep. 10, 2021

(65) Prior Publication Data

US 2023/0085331 A1  Mar. 16, 2023

(51) Int. Cl.
*H05K 7/14* (2006.01)
*H05K 3/30* (2006.01)

(52) U.S. Cl.
CPC ............. *H05K 7/142* (2013.01); *H05K 3/301* (2013.01); *H05K 7/1405* (2013.01)

(58) Field of Classification Search
CPC ....... H05K 7/142; H05K 3/301; H05K 7/1405
USPC .......................................................... 361/752
See application file for complete search history.

(56) References Cited

U.S. PATENT DOCUMENTS

| | | | | |
|---|---|---|---|---|
| 5,136,760 | A * | 8/1992 | Sano ..................... | F16B 5/0635 24/457 |
| 7,352,077 | B2 * | 4/2008 | Shibui .................... | F01D 15/10 290/52 |
| 9,130,421 | B2 * | 9/2015 | Chamberlin ........... | H02K 5/203 |
| 10,462,937 | B1 | 10/2019 | Louco et al. | |
| 2017/0167286 | A1 * | 6/2017 | Ogata ................... | F16C 33/109 |
| 2019/0368413 | A1 * | 12/2019 | Carter ................ | H05K 7/20927 |

FOREIGN PATENT DOCUMENTS

EP      2305981 B1    4/2013

* cited by examiner

*Primary Examiner* — Zhengfu J Feng
(74) *Attorney, Agent, or Firm* — LORENZ & KOPF, LLP

(57) ABSTRACT

A controller for an e-machine of a turbomachine including a support structure, a printed circuit board, and a fastener arrangement that retains the printed circuit board on the support structure, the fastener arrangement including a resilient member that resiliently biases the printed circuit board towards the support structure.

18 Claims, 7 Drawing Sheets

RESILIENT PRINTED CIRCUIT BOARD RETENTION ARRANGEMENT

TECHNICAL FIELD

The present disclosure generally relates to a turbomachine and, more particularly, relates to an integrated e-machine controller for a turbomachine having a fastening arrangement, for example, for fastening printed circuit boards therein.

BACKGROUND

Some turbomachines include an e-machine, such as an electric motor or generator. More specifically, some turbochargers, superchargers, or other fluid compression devices can include an electric motor that is operably coupled to the same shaft that supports a compressor wheel, turbine wheel, etc. The electric motor may drivingly rotate the shaft, for example, to assist a turbine stage of the device. In some embodiments, the e-machine may be configured as an electric generator, which converts mechanical energy of the rotating shaft into electric energy.

These devices may also include a controller that, for example, controls operation of the e-machine. More specifically, the control system may control the torque, speed, or other operating parameters of the e-machine and, as such, control operating parameters of the rotating group of the device.

However, conventional controllers of such fluid compression devices suffer from various deficiencies. These controllers can be heavy and/or bulky. Furthermore, the electronics included in the controller may generate significant heat, which can negatively affect operations. Similarly, the operating environment of the device can subject the electronics to high temperatures, vibrational loads, or other conditions that negatively affect operations. In addition, manufacture and assembly of conventional control systems can be difficult, time consuming, or otherwise inefficient.

Thus, it is desirable to provide an e-machine controller for a fluid compression device that is compact and that is retained in a robust manner. It is also desirable to thermally isolate the controller from high temperature vehicle components and to provide electrical isolation for current carrying parts from each other and electrical grounds. The current carrying parts may expand and contract during operation thereby requiring isolation gaps that compensate for the changes in physical sizing. It is also desirable to provide such a controller that provides manufacturing efficiencies. Other desirable features and characteristics of the present disclosure will become apparent from the subsequent detailed description and the appended claims, taken in conjunction with the accompanying drawings and this background discussion.

BRIEF SUMMARY

In one embodiment, a controller for an e-machine of a turbomachine having a rotating group that is supported for rotation about an axis is disclosed. The controller includes a support structure, a printed circuit board, and a fastener arrangement that retains the printed circuit board on the support structure, the fastener arrangement including a resilient member that resiliently biases the printed circuit board towards the support structure In another embodiment, a method of manufacturing a controller for an e-machine of a turbomachine having a rotating group that is supported for rotation about an axis. The method of manufacturing including providing a support structure, providing a printed circuit board, and attaching the printed circuit board to the support structure with a fastener arrangement wherein the fastener arrangement includes a resilient member that resiliently biases the printed circuit board towards the support structure.

Moreover, a turbocharger including an integrated controller is disclosed having a rotating group that is supported for rotation about an axis. The turbocharger includes a support structure including a notch for receiving a spring clip and wherein the notch restricts lateral movement of the spring clip, a printed circuit board, a fastener arrangement that retains the printed circuit board on the support structure, the fastener arrangement including the spring clip to resiliently bias the printed circuit board towards the support structure, wherein the spring clip includes a first arm and a second arm that are attached and that are resiliently deflectable relative to each other, wherein the first arm engages the printed circuit board and the second arm engages the support structure to resiliently bias the printed circuit board toward the support structure, a boss affixed to a surface of one of the printed circuit board and the support structure, wherein the spring clip engages the boss to retain the printed circuit board on the support structure, and a guide pin rigidly affixed to the support structure and passing through an aperture in the printed circuit board such that lateral movement of the printed circuit board relative to the support structure is restricted.

BRIEF DESCRIPTION OF THE DRAWINGS

The present disclosure will hereinafter be described in conjunction with the following drawing figures, wherein like numerals denote like elements, and wherein.

DETAILED DESCRIPTION

The following detailed description is merely exemplary in nature and is not intended to limit the present disclosure or the application and uses of the present disclosure. Furthermore, there is no intention to be bound by any theory presented in the preceding background or the following detailed description.

Broadly, example embodiments disclosed herein include an improved controller for a turbomachine. The controller may be integrated into, packaged among, and compactly arranged on the turbomachine for improved performance and for reducing the size and profile of the turbomachine. In some embodiments, the integrated controller may wrap, extend, span circumferentially, or otherwise be arranged about an axis of rotation defined by the rotating group of the turbomachine. The housing of the controller may be generally arcuate in some embodiments, and internal components (e.g., support structures, electronics components, and/or coolant system features) may be shaped, configured, assembled, and arranged about the axis to reduce the size of the turbomachine.

In addition, the turbomachine may be a compressor device, and the integrated controller may be arranged proximate the compressor section (e.g., proximate a compressor housing). Furthermore, the turbomachine may include a turbine section, and the compressor device may be disposed proximate thereto (e.g., proximate the turbine housing). The controller may, in some embodiments, be arranged compactly between a compressor section and a turbine section of the turbomachine. Furthermore, in some embodiments, the integrated controller may be wrapped or disposed about an e-machine (e.g., a motor) of the turbomachine. The controller may be configured for controlling the e-machine and their close proximity may increase operating efficiency.

The controller may, thus, be closely integrated and packaged within the turbomachine. The integrated controller may also include a fastener arrangement that robustly supports the electronics components. The fastener arrangement may retain the printed circuit board within the assembly and may include at least one resilient member. The fastener arrangement may provide robust attachment of the printed circuit board to support structure. The resilient member may facilitate manufacture and assembly of the integrated controller. Also, the fastener arrangement may occupy relatively little space, which may allow more electrical components to be included on the printed circuit board. Moreover, the resilient member may resiliently flex to account for thermal expansion/contraction of parts within the assembly.

Figure 1:
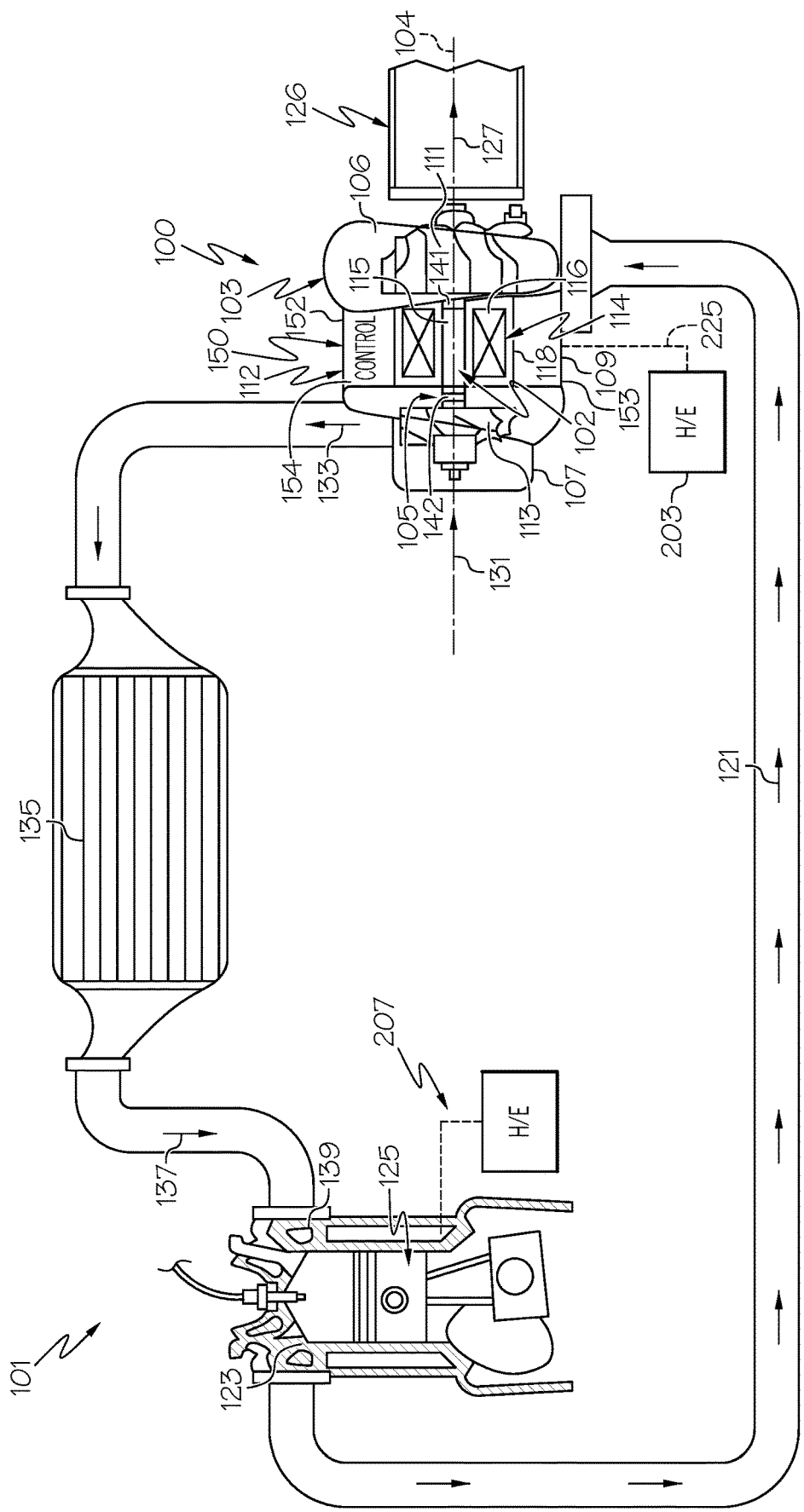
FIG. 1 is a schematic illustration of an engine system with a fluid compressor device that includes an integrated controller according to example embodiments of the present disclosure.

FIG. 1 is a schematic view of an example turbomachine, such as a turbocharger 100 that is incorporated within an engine system 101 and that includes one or more features of the present disclosure. It will be appreciated that the turbocharger 100 could be another turbomachine (e.g., a supercharger, a turbine-less compressor device, etc.) in additional embodiments of the present disclosure. Furthermore, the turbomachine of the present disclosure may be incorporated into a number of systems other than an engine system without departing from the scope of the present disclosure. For example, the turbomachine of the present disclosure may be incorporated within a fuel cell system for compressing air that is fed to a fuel cell stack, or the turbomachine may be incorporated within another system without departing from the scope of the present disclosure.

Generally, the turbocharger 100 may include a housing 103 and a rotating group 102, which is supported within the housing 103 for rotation about an axis 104 by a bearing system 105. The bearing system 105 may be of any suitable type, such as a roller-element bearing or an air bearing system.

As shown in the illustrated embodiment, the housing 103 may include a turbine housing 106, a compressor housing 107, and an intermediate housing 109. The intermediate housing 109 may be disposed axially between the turbine and compressor housings 106, 107.

Additionally, the rotating group 102 may include a turbine wheel 111, a compressor wheel 113, and a shaft 115. The turbine wheel 111 is located substantially within the turbine housing 106. The compressor wheel 113 is located substantially within the compressor housing 107. The shaft 115 extends along the axis of rotation 104, through the intermediate housing 109, to connect the turbine wheel 111 to the compressor wheel 113. Accordingly, the turbine wheel 111 and the compressor wheel 113 may rotate together as a unit about the axis 104.

The turbine housing 106 and the turbine wheel 111 cooperate to form a turbine stage (i.e., turbine section) configured to circumferentially receive a high-pressure and high-temperature exhaust gas stream 121 from an engine, specifically, from an exhaust manifold 123 of an internal combustion engine 125. The turbine wheel 111 and, thus, the other components of the rotating group 102 are driven in rotation around the axis 104 by the high-pressure and high-temperature exhaust gas stream 121, which becomes a lower-pressure and lower-temperature exhaust gas stream 127 that is released into a downstream exhaust pipe 126.

The compressor housing 107 and compressor wheel 113 form a compressor stage (i.e., compressor section). The compressor wheel 113, being driven in rotation by the exhaust-gas driven turbine wheel 111, is configured to compress received input air 131 (e.g., ambient air, or already-pressurized air from a previous-stage in a multistage compressor) into a pressurized airstream 133 that is ejected circumferentially from the compressor housing 107. The compressor housing 107 may have a shape (e.g., a volute shape or otherwise) configured to direct and pressurize the air blown from the compressor wheel 113. Due to the compression process, the pressurized air stream is characterized by an increased temperature, over that of the input air 131.

The pressurized airstream 133 may be channeled through an air cooler 135 (i.e., intercooler), such as a convectively cooled charge air cooler. The air cooler 135 may be configured to dissipate heat from the pressurized airstream 133, increasing its density. The resulting cooled and pressurized output air stream 137 is channeled into an intake manifold 139 of the internal combustion engine 125, or alternatively, into a subsequent-stage, in-series compressor.

Furthermore, the turbocharger 100 may include an e-machine stage 112. The e-machine stage 112 may be cooperatively defined by the intermediate housing 109 and by an e-machine 114 housed therein. The shaft 115 may extend through the e-machine stage 112, and the e-machine 114 may be operably coupled thereto. The e-machine 114 may be an electric motor, an electric generator, or a combination of both. Thus, the e-machine 114 may be configured as a motor to convert electrical energy to mechanical (rotational) energy of the shaft 115 for driving the rotating group 102. Furthermore, the e-machine 114 may be configured as a generator to convert mechanical energy of the shaft 115 to electrical energy that is stored in a battery, etc. As stated, the e-machine 114 may be configured as a combination motor/generator, and the e-machine 114 may be configured to switch functionality between motor and generator modes in some embodiments as well.

For purposes of discussion, the e-machine 114 will be referred to as a motor 116. The motor 116 may include a rotor member (e.g., a plurality of permanent magnets) that are supported on the shaft 115 so as to rotate with the rotating group 102. The motor 116 may also include a stator member (e.g., a plurality of windings, etc.) that is housed and supported within the intermediate housing 109. In some embodiments, the motor 116 may be disposed axially between a first bearing 141 and a second bearing 142 of the bearing system 105. Also, the motor 116 may be housed by a motor housing 118 of the intermediate housing 109. The motor housing 118 may be a thin-walled or shell-like housing that encases the stator member of the motor 116. The motor housing 118 may also encircle the axis 104, and the shaft 115 may extend therethrough.

Furthermore, the turbocharger 100 may include an integrated controller 150. The integrated controller 150 may generally include a controller housing 152 and a number of internal components 154 (e.g., circuitry, electronic components, cooling components, support structures, etc.) housed within the controller housing 152. The integrated controller 150 may control various functions. For example, the integrated controller 150 may control the motor 116 to thereby control certain parameters (torque, angular speed, START/STOP, acceleration, etc.) of the rotating group 102. The integrated controller 150 may also be in communication with a battery, an electrical control unit (ECU), or other components of the respective vehicle in some embodiments. More specifically, the integrated controller 150 may receive DC power from a vehicle battery, and the integrated controller 150 may convert the power to AC power for controlling the motor 116. In additional embodiments wherein the e-machine 114 is a combination motor/generator, the integrated controller 150 may operate to switch the e-machine 114 between its motor and generator functionality.

Figure 3:
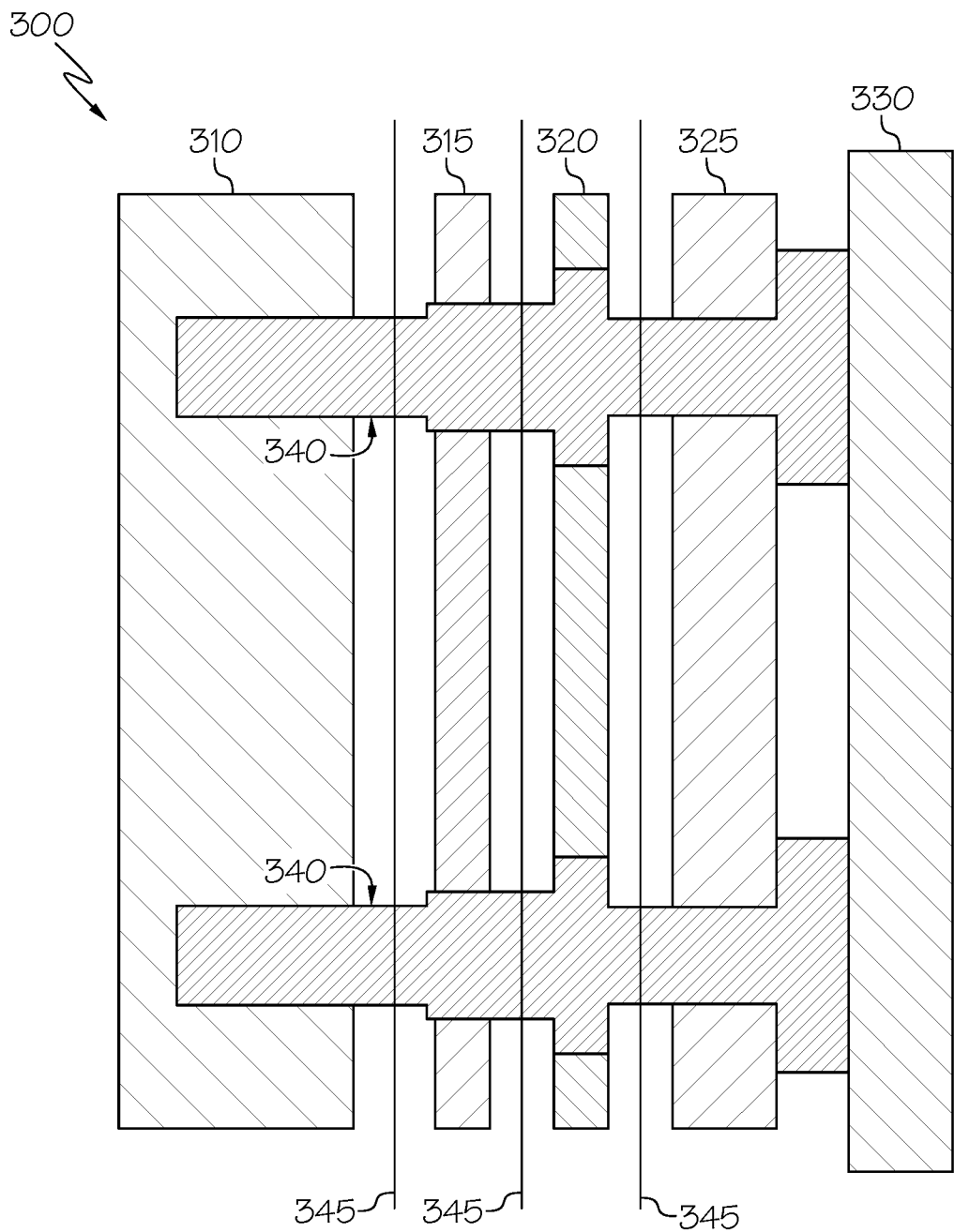
FIG. 3 is a cross sectional view of an electronics package of an integrated controller according to exemplary embodiments of the present disclosure.
Figure 4:
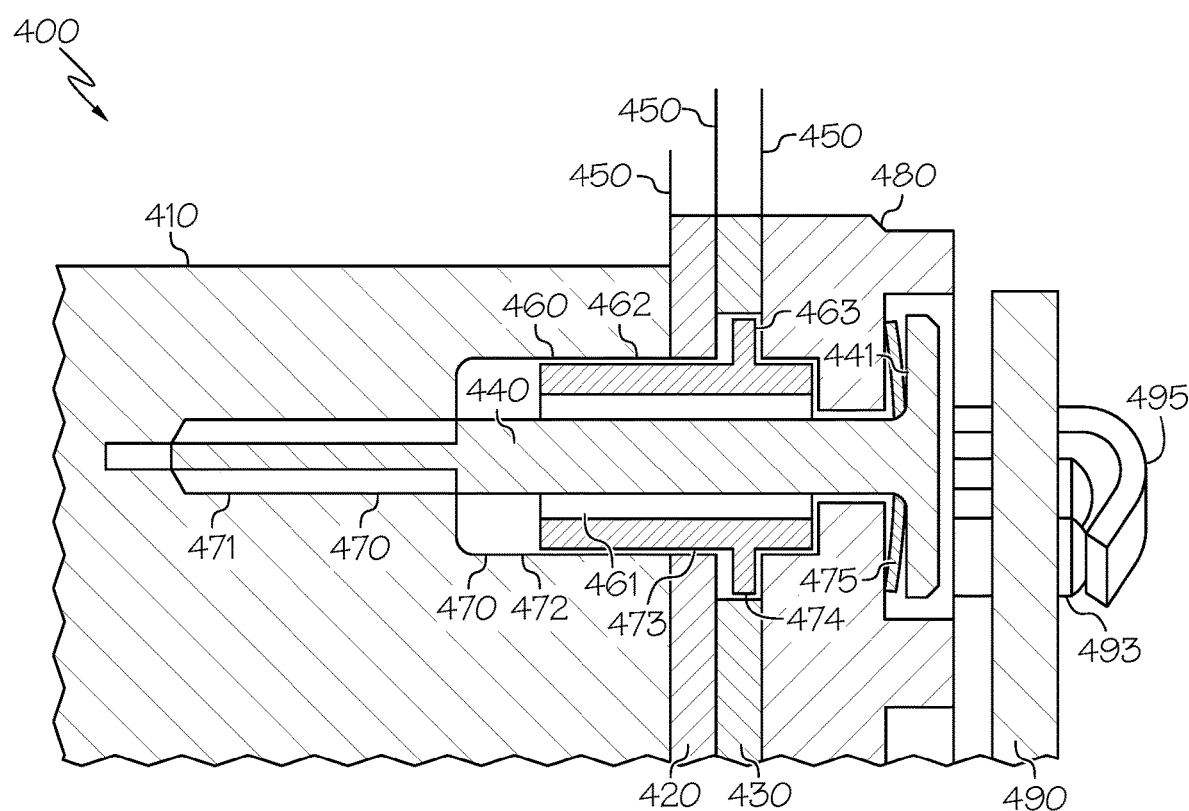
FIG. 4 is a cross sectional view of a fastener arrangement of an integrated controller according to exemplary embodiments of the present disclosure.

In some embodiments, the integrated controller 150 may be disposed axially between the compressor stage and the turbine stage of the turbocharger 100 with respect to the axis 104. Thus, as illustrated, the integrated controller 150 may be disposed and may be integrated proximate the motor 116. For example, as shown in the illustrated embodiment, the integrated controller 150 may be disposed on and may be arranged radially over the motor housing 118. More specifically, the integrated controller 150 may extend and wrap about the axis 104 to cover over the motor 116 such that the motor 116 is disposed radially between the shaft 115 and the integrated controller 150. The integrated controller 150 may also extend about the axis 104 in the circumferential direction and may cover over, overlap, and wrap over at least part of the motor housing 118. In some embodiments, the integrated controller 150 may wrap between approximately forty-five degrees (45°) and three-hundred-sixty-five degrees (365°) about the axis 104. For example, as shown in FIGS. 2-4, the controller 150 wrap approximately one-hundred-eighty degrees (180°) about the axis 104.

Figure 2:
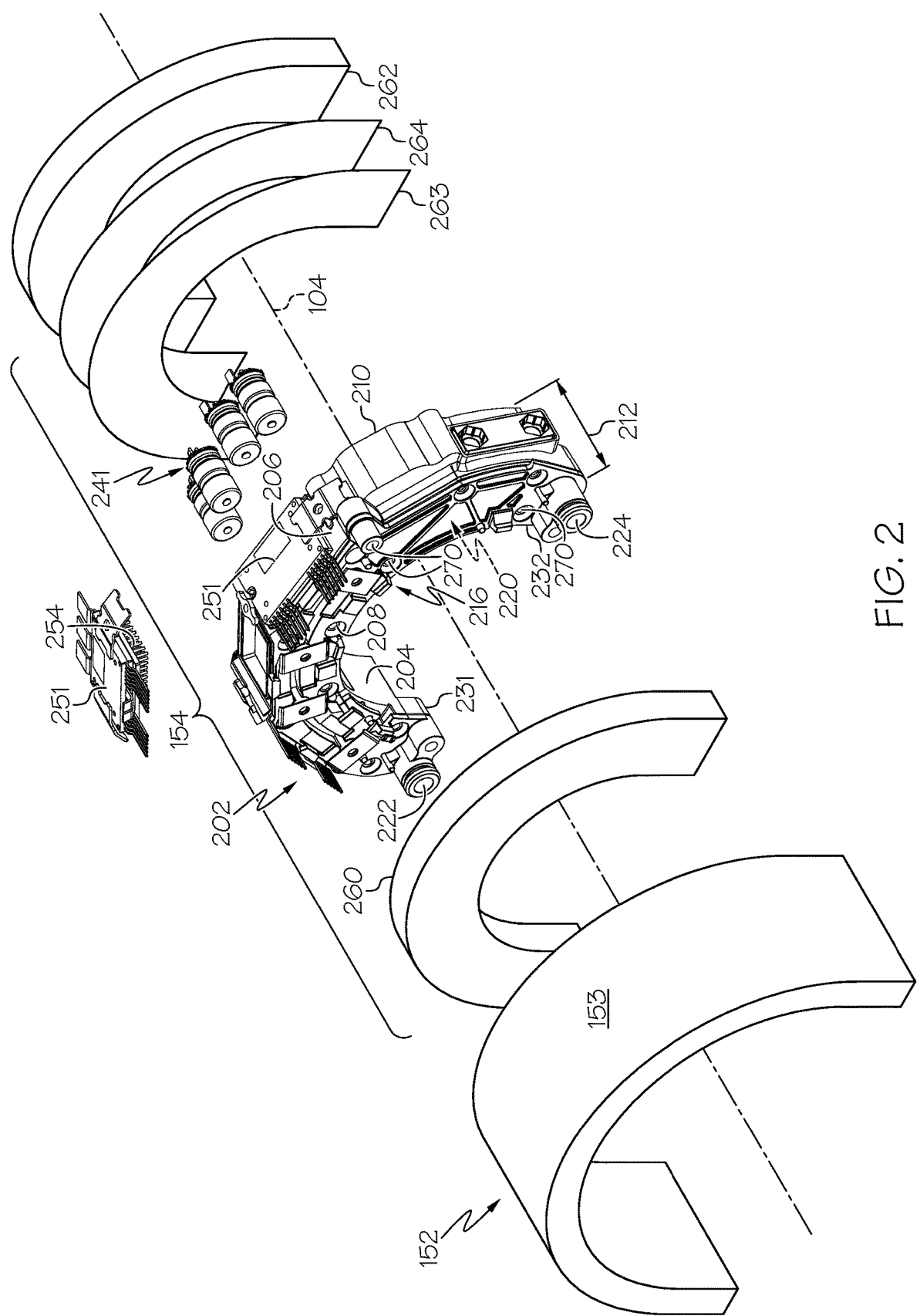
FIG. 2 is an exploded isometric view of the integrated controller according to exemplary embodiments of the present disclosure.

The controller housing 152 is shown schematically in FIG. 2. As illustrated, the housing 152 may generally be arcuate so as to extend about the axis 104 and to conform generally to the rounded profile of the turbocharger 100. The housing 152 may also be an outer shell-like member that is hollow and that encapsulates the internal components 154. Electrical connectors may extend through the housing 152 for electrically connecting the internal components 154. Furthermore, there may be openings for fluid couplings (e.g., couplings for fluid coolant). Additionally, the controller housing 152 may define part of the exterior of the turbocharger 100. An outer surface 153 of the controller housing 152 may extend about the axis 104 and may face radially away from the axis 104. The outer surface 153 may be at least partly smoothly contoured about the axis 102 as shown, or the outer surface 153 may include one or more flat panels that are arranged tangentially with respect to the axis 104 (e.g., a series such flat panels that are arranged about the axis 104). The outer surface 153 may be disposed generally at the same radius as the neighboring compressor housing 107 and/or turbine housing 106 as shown in FIG. 1. Accordingly, the overall size and profile of the turbocharger 100, including the controller 150, may be very compact.

The internal components 154 may be housed within the controller housing 152. Also, at least some of the internal components 154 may extend arcuately, wrap about, and/or may be arranged about the axis 104 as will be discussed. Furthermore, as will be discussed, the internal components 154 may be stacked axially along the axis 104 in close proximity such that the controller 150 is very compact. As such, the integrated controller 150 may be compactly arranged and integrated with the turbine stage, the compressor stage, and/or other components of the turbocharger 100. Also, internal components 154 of the controller 150 may be in close proximity to the motor 116 to provide certain advantages. For example, because of this close proximity, there may be reduced noise for more efficient control of the motor 116.

Furthermore, the controller 150 may include a number of components that provide robust support and that provide efficient cooling. Thus, the turbocharger 100 may operate at extreme conditions due to elevated temperatures, mechanical loads, electrical loads, etc. Regardless, the controller 150 may be tightly integrated into the turbocharger 100 without compromising performance.

Referring now to FIG. 2, the internal components 154 of the integrated controller 150 will be discussed in greater detail according to various embodiments. Generally, the integrated controller 150 from FIG. 1 may include a coolant core 202. The coolant core 202 may be configured for supporting a number of electronic components, fastening structures, and other parts of the integrated controller 150. The coolant core 202 may also define one or more coolant passages through which a fluid coolant flows for cooling the electronics components. The coolant core 202 may receive a flow of a coolant therethrough for cooling the integrated controller 150. As illustrated in FIG. 2, the coolant core extends at least partly over the motor 116 in a circumferential direction about the axis 104.

The coolant core 202 may be elongate but curved and arcuate in shape and may extend in a tangential and/or circumferential direction about the axis 104. In other words, the coolant core 202 may wrap at least partially about the axis 104 to fit about the motor 116 of the turbocharger 100. Accordingly, the coolant core 202 may define an inner radial area 204 that faces the axis 104 and an outer radial area 206 that faces away from the axis 104. Moreover, the coolant core 202 may include a first axial end 208 and a second axial end 210, which face away in opposite axial directions. The first axial end 208 may face the compressor section of the turbocharger 100 in some embodiments and the second axial end 210 may face the turbine section in some embodiments. The coolant core 202 may also define an axial width 212, which may be defined parallel to the axis 104 between the first and second axial ends 208, 210. Additionally, the coolant core 202 may be semi-circular and elongate so as to extend circumferentially between a first angular end 231 and a second angular end 232, which are spaced apart angularly about the axis (e.g., approximately one-hundred-eighty degrees (180°) apart).

The coolant core 202 may be cooperatively defined by a plurality of parts, such as a reservoir body 214 and a cover plate 216. Both the reservoir body 214 and the cover plate 216 may be made from strong and lightweight material with relatively high thermal conductivity characteristics (e.g., a metal, such as aluminum). In some embodiments, the reservoir body 214 and/or the cover plate 216 may be formed via a casting process (e.g., high pressure die casting).

The cover plate 216 may be relatively flat, may be arcuate (e.g., semi-circular), and may lie substantially normal to the axis 104. Also, the cover plate 216 may define the first axial end 208 of the coolant core 202. The reservoir body 214 may be a generally thin-walled and hollow body with an open side 209 that is covered over by the cover plate 216 and a second side 211 that defines the second axial end 210 of the coolant core 202. The cover plate 216 may be fixed to the reservoir body 214 and sealed thereto with a gasket, seal, etc. One or more fasteners (e.g., bolts or other fasteners may extend axially through the cover plate 216 and the reservoir body 214 for attaching the same. The cover plate 216 and the reservoir body 214 may include one or more fastener holes 270 that receive a bolt or other fastener for attaching the first side electronics to the coolant core 202. Accordingly, the cover plate 216 and the reservoir body 214 may cooperate to define a fluid passage 220 that extends through the coolant core 202. In some embodiments, the fluid passage 220 may be elongate and may extend generally about the axis 104 from the first angular end 231 to the second angular end 232.

The coolant core 202 may also include at least one fluid inlet 222 to the fluid passage 220 and at least one fluid outlet 224 from the fluid passage 220. In some embodiments, for example, there may be a single, solitary inlet 222. The inlet 222 may be disposed proximate the first angular end 231 and may include a round, cylindrical, and hollow connector 223 that projects along the axis 104 from the cover plate 216 away from the first axial end 208. Also, in some embodiments, there may be a single, solitary outlet 224. The outlet 224 may be disposed proximate the second angular end 232 and may include a round, cylindrical, and hollow connector 226 that projects along the axis 104 from the cover plate 216 away from the first axial end 208.

The coolant core 202 may be fluidly connected to a coolant circuit 225, which is illustrated schematically in FIG. 1. The coolant circuit 225 may circulate any suitable fluid, such as a liquid coolant, between the fluid passage 220 and a heat exchanger 203 (FIG. 1). More specifically, coolant may flow from the inlet 222, through the fluid passage 220, to the outlet 224, thereby removing heat from the integrated controller 150, and may continue to flow through the heat exchanger 203 to be cooled before flowing back to the inlet 222 of the coolant core 202, and so on. Furthermore, as shown in FIG. 1, the heat exchanger 203 may, in some embodiments, be separate and fluidly independent of an engine coolant system 207 that cools the engine 125.

The second axial end 210 of the coolant core 202 may include one or more inner apertures 240. The inner apertures 240 may include a plurality of pockets, recesses, receptacles, etc. that are open at the second side 211 of the reservoir body 214 and that are disposed proximate the inner radial area 204 of the core 202 in the radial direction. As shown, the inner apertures 240 may be generally cylindrical in some embodiments with circular profiles and with the longitudinal axis thereof arranged parallel to the axis 104. There may be a plurality of inner apertures 240 arranged at different angular positions with respect to the axis 104 along the inner radial area 204 of the core 202. The size and shape of the inner apertures 240 may correspond to certain ones of the internal components 154 of the integrated controller 150. For example, the inner apertures 240 may be cylindrical, as shown, to receive and support inner electronics components, such as a series of capacitors 241 (FIG. 2) of the controller 150. The reservoir body 214 may define the apertures 240 with relatively thin walls 245 or other structures that separate the capacitors 241 within the apertures 240 from the coolant within the fluid passage 220. Accordingly, the capacitors 241 may be effectively cooled by the coolant circuit 225.

The second side 211 of the reservoir body 214 may include a second side aperture 246 that has an ovate profile and that is recessed in the axial direction into the reservoir body 214. The second side aperture 246 may be arranged with the major axis of its ovate shape extending tangentially with respect to the axis 104. Also, the minor axis may extend radially and may be large enough to extend over both the inner radial area 204 and the outer radial area 206 of the coolant core 202. Furthermore, the second side aperture 246 may be shaped correspondingly to another electronics component, such as an inverter, capacitor, a battery, or another piece of control equipment.

Additionally, the outer radial area 206 of the coolant core 202 may extend about the axis 104 and may include one or more seats 219. The seats 219 may be rectangular and may lie in a respective tangential plane with respect to the axis 104. The seats 219 may be disposed and spaced apart at different angular positions with respect to the axis 104. Furthermore, seats 219 may include a respective outer aperture 250 extending radially therethrough. In some embodiments, at least one outer aperture 250 may be a rectangular hole that is centered within the respective seat 219 and that passes through the reservoir body 214 to the fluid passage 220 therein. These outer apertures 250 may be sized and configured to receive an outer electronics component 251 (FIG. 2), such as a substantially-flat and rectangular transistor, circuit component, switch component, MOSFET transistor, etc. The electronics component 251 may be partially received in a respective outer aperture 250 and may be supported and mounted on a respective seat 219 so as to cover over the respective outer aperture 250. There may be a gasket or other sealing member that seals the electronics component 251 to the seat 219. Also, the electronics component 251 may include one or more thermally-conductive projections 254 (FIG. 2), such as an array of fins, rails, posts, pins, etc.) that project from an underside thereof to extend into the fluid passage 220. Accordingly, coolant within the coolant circuit 225 may flow across the projections 254 to provide highly effective cooling to the electronics component 251.

Additionally, the first axial end 208 defined substantially by the cover plate 216 may provide one or more surfaces for mounting and supporting a first side electronics package 260. The first side electronics package 260 is represented schematically in FIG. 2 as a semi-circular body that corresponds generally to the shape of the coolant core 202, and it will be appreciated that the first side electronics package 260 may comprise a plurality of electronics components, such as one or more conductive bus bars, circuit board assemblies, etc. There may also be support structures, such as brackets, plates, etc. for supporting the electronics package 260. Furthermore, there may be a fastener arrangement for attaching the first side electronics package 260 to the first axial end 208 of the coolant core 202. The fastener arrangement may include support structures with threaded cavities, bolts, washers, bushings, and the like. The first side electronics package 260 may be layered on the first axial end 208 such that both extend arcuately about the axis 104. The first side electronics package 260 may be attached to the first axial end 208 in any suitable fashion, such as fasteners. Accordingly, the first side electronics package 260 may be in close proximity with at least one surface of the package 260 layered on and abutting an opposing surface of the coolant core 202 such that the coolant core 202 may absorb heat therefrom with high efficiency and effectiveness.

Likewise, the second axial end 210 of the coolant core 202 may provide one or more surfaces for mounting and supporting a second side electronics package 262. Like the first side electronics package 260, the second side electronics package 262 is represented schematically, however, it will be appreciated that the package 262 may include a number of electronic and/or mechanically supportive/fastening parts. The second side electronics package 262 may be arcuate and may extend partly about the axis 104. The second side electronics package 262 may be layered on the second axial end 210 such that both extend arcuately about the axis 104. The second side electronics package 262 may be attached to the second axial end 210 in any suitable fashion. Moreover, the second side electronics package 262 may be in close proximity to the coolant core 202 with at least one surface of the package 262 layered on and abutting an opposing surface of the coolant core 202 for efficient and effective cooling. In at least one exemplary embodiment, a first bus bar 263 and a second bus bar 264 may be mounted between the second side electronics package 262 and the second axial end 210. The first bus bar 263 and the second bus bar 264 may be used to conduct electrical current to the second side electronics package 262, the outer electronics component 251 and/or the first side electronics package 260. The conducted electrical current may be direct current or alternating current.

The fluid passage 220 for the coolant within the coolant core 202 may be defined between the inner surfaces of the reservoir body 214, the inner face of the cover plate 216, and the inner faces of the outer electronics components 251. The fluid passage 220 may also extend arcuately about the axis 104, from the inlet 222 to the outlet 224. Coolant may enter via the inlet 222, flow generally from the first angular end 231 to the second angular end 232 and exit via the outlet 224. Accordingly, the coolant may flow in close proximity and across the core-facing surfaces of the outer electronics components 251, the capacitors 241, the first side electronics package 260, and the second side electronics package 262.

Accordingly, in some embodiments, the coolant core 202 may be substantially surrounded by heat-producing electronics components. The coolant core 202 may be thermally coupled to these components due to the close proximity and, in some areas, due to abutting contact therebetween. Some interfaces (e.g., at the projections 254) may provide direct fluid contact with the coolant. As shown in FIG. 2, the coolant core 202 may be thermally coupled to the electronics components on the inner radial area 204, the outer radial area 206, the first axial end 208 and the second axial end 210. The fluid passage 220 may be defined radially between the inner radial area 204 and the outer radial area 206 to receive heat from both the inner electronics components (e.g., the capacitors 241) and the outer electronics components 251. Moreover, the fluid passage 220 may be defined axially between the first and second axial ends 208, 210 to receive heat from both the first and second side electronics packages 260, 262.

Furthermore, the controller 150 may be integrated and packaged among the turbine section, the motor 116, and/or the compressor section, any of which may operate at elevated temperatures. The coolant core 202 and the coolant circuit 225 may provide cooling to these surrounding components as well. Thus, it will be appreciated that the controller 150 may be packaged compactly and that there may be several features that generate heat during operation; however, the coolant core 202, the coolant circuit 225, and other features discussed above may provide effective and efficient cooling.

Moreover, the controller 150 may be robustly supported on the turbocharger 100. The coolant core 202 may provide mechanical support while also providing compact packaging for the controller 150. Also, the part count may be relatively low and the controller 150 may be manufactured and assembled in an efficient manner.

Turning now to FIG. 3, an exemplary cross-sectional view of an electronics package 300 of an integrated controller 150 is shown. The exemplary electronics package 300 may be generally representative of one or more of the first side electronics package 260 or the second side electronics package 262 as described in accordance with FIG. 2. The exemplary electronics package 300 may include a support structure 310, a first bus bar 315, a second bus bar 320, a backing plate 325, a printed circuit board 330, at least one fastener arrangement 340, and a plurality of non-conductive sheets 345. The exemplary fastener arrangements 340 may include a bolt, a bushing, and a spring washer for rigidly affixing the first bus bar 315, the second bus bar 320, and the backing plate 325 to the support structure 310.

The support structure 310 may be representative of the coolant core 202 of FIG. 2 in some embodiments; however, it will be appreciated that the support structure 310 may be another part of the integrated controller 150 or another engine component, turbomachine, integrated controller, or other vehicle component. The support structure may form a rigid structure for providing support to the electronic components of the exemplary electronics package 300. Ideally, the support structure 310 may be integrated into the turbomachine 100 and the controller 150.

The first bus bar 315 and the second bus bar 320 in this exemplary configuration may be used to conduct voltages used by the electronics package and/or the turbomachine and integrated controller. The first bus bar 315 may carry a first electrical voltage such as a direct current (DC) voltage at a first DC voltage level or an alternating current (AC) signal with a first AC voltage and a first phase. Likewise, the second bus bar 320 may carry a second electrical voltage such as a direct current (DC) voltage at a second DC voltage level or an alternating current (AC) signal with a second AC voltage and a second phase. The support structure 310, the first bus bar 315, the second bus bar 320 and the backing plate 325 may be electrically isolated from each other by the plurality of non-conductive sheets 345. In some exemplary embodiments, the non-conductive sheets are separate from the other components and are fixed in place during assembly of the electronics package 300. In other embodiments, the non-conductive sheets 345 may be formed by coating the various components, such as the first bus bar 315 and the second bus bar 320 with a film or layer of non-conductive material such as polyamide or the like.

The backing plate 325 may be used to support and distribute a uniform clamping force on the first bus bar 315 and second bus bar 320 when the fastener arrangements 340 are attached to the support structure 310. The fastener arrangements 340 may have a threaded portion for engaging a threaded cavity in the support structure 310. The fastener arrangements 340 may further have smooth portions for rotating freely within a bushing or a non-threaded cavity within the support structure 310. The fastener arrangements 340 may further have portions of differing diameters to secure different components at different layers of the electronics package.

The printed circuit board 330 may be further affixed to the electronics package 300 for conditioning or controlling the voltages on the first bus bar 315 and the second bus bar 320 as well as providing control information, sensors and the like to the integrated controller 150 of the turbomachine 100. The printed circuit board 330 may be affixed within the electronics package using the fastener arrangements 340 or may be affixed by other means independent of the fastener arrangements 340. The printed circuit board 330 may be affixed with other fasteners, such as screws, or bossed to avoid any possible distortion resulting from the holding force of the fastener arrangements 340

Turning now to FIG. 4, additional embodiments of a cross sectional view of a fastener assembly 400 of an integrated controller according to exemplary embodiments of the present disclosure is represented. The exemplary fastener assembly 400 may form a portion of the controller 150 for the motor 116 of the turbomachine 100 of FIG. 1, for example.

In one or more exemplary embodiments, the support structure 410 may form a portion of the coolant core 202 of the integrated controller 150 or the like. The support structure 410 will have an electrical potential that is different from the electrical potential of the first bus bar 420 and the second bus bar 430. The support structure 410 may be configured to provide physical support and may be electrically and/or thermally isolated from the first bus bar 420 and the second bus bar 430.

The first bus bar 420 may be configured for suppling a first voltage to the integrated controller 150 and the second bus bar 430 for supplying a second voltage to the integrated controller 150. In some embodiments, the first voltage and the second voltage are different direct current voltages wherein the first voltage does not equal the second voltage. Alternatively, the first bus bar 420 and the second bus bar 430 may conduct alternating current (AC) voltages wherein the voltage carried by the first bus bar 420 is out of phase with, or has a different phase than, the voltage carried by the second bus bar 430. In some embodiments, the first bus bar 420 and the second bus bar 430 may be separated by one or more non-conductive sheets 450. These non-conductive sheets 450 may be formed separately from the first bus bar 420 and the second bus bar 430, or the first bus bar 420 and the second bus bar 430 may be coated with a non-conductive material. For example, the non-conductive material may be a dielectric material or other electrically insulating material. In addition, the non-conductive sheets 450 may further include thermal insulating properties. In some exemplary embodiments, the non-conductive sheets 450 may be a polyamide material that is between approximately 0.001 to 0.002 inches thick.

In exemplary embodiments, the first bus bar 420 may be elongated and may extend about the axis 104. Likewise, the second bus bar 430 may be elongate and may extend about the axis 104. Also, the second bus bar may be stacked on the first bus bar in an axial direction with respect to the axis 104. The first bus bar 420 and the second bus bar 430 may be affixed to the support structure 410 by a fastener arrangement 340 of FIG. 3.

In some exemplary embodiments, the fastener arrangement 340 of FIG. 3 may include a sleeve bushing 460, a fastener 440, and a resilient washer 475. In some embodiments, the fastener 440 may be a partially threaded fastener, such as a bolt or the like. The sleeve bushing 460 may be a tubular structure. The sleeve bushing 460 may have an inner surface 461 having an inner radius, an outer surface 462 having an outer radius, and a flange 463 affixed to the outer surface 462 of the sleeve bushing 460. The flange 463 may be circular in some embodiments and may define a flange radius. In some embodiments, the sleeve bushing 460 may be formed of a non-conducting material, such as dielectric material, ceramic, etc., or the bushing 460 may be formed from a conductive material coated with an electrically insulating material.

In some embodiments, the support structure 410 may include a receiver cavity 470 for receiving the fastener 440. The receiver cavity 470 may include a cavity threaded portion 471 with a radius corresponding to a radius of the fastener 440 for threaded attachment therebetween. The receiver cavity 470 may also include a non-threaded portion 472 corresponding to an outer radius of the sleeve bushing 460 for a clearance fit there between. Thus, the fastener 440 may threadably attach to the threaded portion 471 of the receiver cavity 470 with the bushing 460 received in the non-threaded portion 472 of the receiver cavity 471.

The first bus bar 420 may include a first aperture 473 having a first aperture radius corresponding to the outer radius of the sleeve bushing 460 such that there is a clearance fit there between. The second bus bar 430 may include a second aperture 474 having a second radius corresponding to the flange radius of the flange 463 of the sleeve bushing 460 such that there is a clearance fit therebetween. Also, the second radius of the second aperture 474 may be greater than the first radius of the first aperture. In some embodiments, the first bus bar 420 may be applied to the support structure 410 such that the first aperture 473 aligns with the receiver cavity 470 and the second bus bar 430 may be layered upon and applied to an outer surface of the first bus bar such that the second aperture 474 aligns with the first circular aperture 473 and the receiver cavity 470. The sleeve bushing 460 may be located such that a first portion of the outer surface 462 is located and received within the non-threaded portion 472 of the receiver cavity 470, a second portion of the outer surface 472 is located and received within the first aperture 473 of the first bus bar 420, and the flange 463 is located and received within the second aperture 474 of the second bus bar 430. In this embodiment, the fastener 340 is then located within the inner surface 461 of the sleeve bushing 460, having a fastener threaded portion engaged with the cavity threaded portion 471 and fastener head 441 received in a recess of the backing plate 480.

The assembly may optionally include a backing plate 480 that is also secured by the fastener 440 in order to distribute loads over the first bus bar 420, the second bus bar 430 and the support structure 410. The backing plate 480 may be a relatively flat plate that is elongate and that extends at least partly about the axis 104. The backing plate 480 may be referred to as a backing plate in some embodiments. This backing plate 480 may be fabricated, machined from, or molded from, aluminum and may be stiff and strong to resist deformation as a result of force applied by the fasteners 440.

When fastening the first bus bar 420 and the second bus bar 430 to the support structure 410, it is desirable to provide a sufficient creep distance between components carrying an electrical charge and grounded components. During assembly, a flat wide metal washer (not shown) between the spring washer and plastic bushing may be used to increase area which the clamp force is applied to the plastic bushing. In addition, suitable metal feature may be formed in the support structure 480 to increase the clamping force area of the resilient washer 475. In order to achieve a safe creep distance around the fastener 440 while limiting the risk of the bus bars 420, 430 contacting each other or other metal structures and short circuiting, it is advantageous that the first diameter of the first circular aperture 473, the second circular aperture 474, and the second portion of the outer surface 473 of the receiver cavity 470 have differing radii such that the edges of the apertures do not align during fastening to allow for a safe creep distance around the fastener 440. In an alternate embodiment, the support structure 410 and/or the backing plate 480 may be counterbored (not shown) and the adjacent non-conductive sheets 450 may be extended to overhang the counterbore. The larger diameter of the counterbore enlarges the safe creep distance around the fastener 440.

The fastener arrangement 400 may further include a resilient member, such as a resilient washer 475, situated between a portion of the fastener 440 and the backing plate 480. The resilient washer 475 may be a spring washer, a Belleville washer, etc. The resilient washer 475 may be annular and may be received on the fastener 440, disposed axially between the head 441 of the fastener 440 and the backing plate 480. The resilient washer 475 may resiliently flex from a neutral position to a flexed position as the fastener 440 is attached to support structure 410. In addition, an intermediate metal surface, such as a flat washer, or flat feature of the backing plate 480, may be used to spread the load out across the plastic bushing from the resilient washer 475.

In some embodiments, the sleeve bushing 460 may be malleable or flexible and may be distorted such that the outer radius is increased in response to the pressure from the fastener assembly. This distortion may have the effect of providing pressure between the distorted sleeve bushing 460 and the inside of the receiver cavity, the inner surface of the first aperture 473 and/or the inner surface of the second aperture 474. This distortion may then have the beneficial effect of further securing the first bus bar 420 and the second bus bar 430 to the support structure 410. Accordingly, the sleeve bushing 460 may include a resilient member that is resiliently flexible between a neutral position and a flexed position, and wherein the resilient member is in the flexed position when the fastener arrangement 400 attaches the first bus bar 420 and the second bus bar 430 to the support structure 410.

The fastener arrangement 400 may robustly support the components of the integrated controller 150 and may electrically isolate components from each other as needed. Also, the fastener arrangement 400 may provide compact packaging for the integrated controller 150. The fastener arrangement 400 may facilitate increased manufacturing efficiency and ease of assembly. The fastener arrangement 400 addresses the need to secure the first bus bar 420 and the second bus bar 430 to the support structure 410 in a manner that facilitates thermal conduction from the bus bars 420, 430 to the support structure 410 which may be formed from a portion of the coolant core 202. Specifically, for example, heat of the second bus bar 430 may transfer conductively to the first bus bar 420, and/or the heat of the first bus bar 420 may transfer conductively to the support structure 410, which may provide cooling via a fluid coolant flowing therethrough. The durable sleeve bushing 460 may provide mechanical stability and fixation while providing good electrical isolation. The sleeve bushing 460 may be fabricated from a glass and mineral filled plastic or a ceramic composite to allow for high pressure clamping by the fastener 440 in a high temperature environment. The sleeve bushing 460 facilitate assembly by electrically isolating the fastener 440 and fastener head 441 from the electrically active first bus bar 420 and second bus bar 430. The design of the sleeve bushing 460 and the material chosen for the sleeve bushing 460 helps overcome harsh thermal and vibration environments (e.g., those of a vehicle-engine-mounted environment) and is capable of being used for high voltage applications as well as allowing the collocation of multiple busbars instead of just a single busbar.

In some exemplary embodiments, a printed circuit board 490 may be affixed to the backing plate 480 in a manner that allows for thermal expansion and contraction of the backing plate 480 without damaging the printed circuit board 490. The printed circuit board 490 may include circuitry, such as power conditioning circuitry, power control circuitry, power conversion circuitry, or other electronic circuitry for use by the integrated controller 150. It is desirable to avoid repeated physical stress on the printed circuit board 490 as repleted flexing or distortion of the printed circuit board may result in cracking of the circuit board, separation of surface mounted components, and/or separation of solder joints.

The integrated controller may include a spring clip 495 to provide a clamping force orthogonally on the printed circuit board 490 while allowing for some movement of the printed circuit board 495 laterally along the plane of the printed circuit board 495. The printed circuit board 490 may further include a boss 493 raised in relief from the printed circuit board 490 wherein the spring clip 495 applies pressure to the boss 493 in order to provide the clamping force orthogonally to the printed circuit board 490 while reducing wear on the printed circuit board 490 due to lateral movement of the printed circuit board 490 resulting from thermal expansion and contraction of the backing plate 480, the first bus bar 420, the second bus bar 430 and/or the support structure 410.

Figure 5:
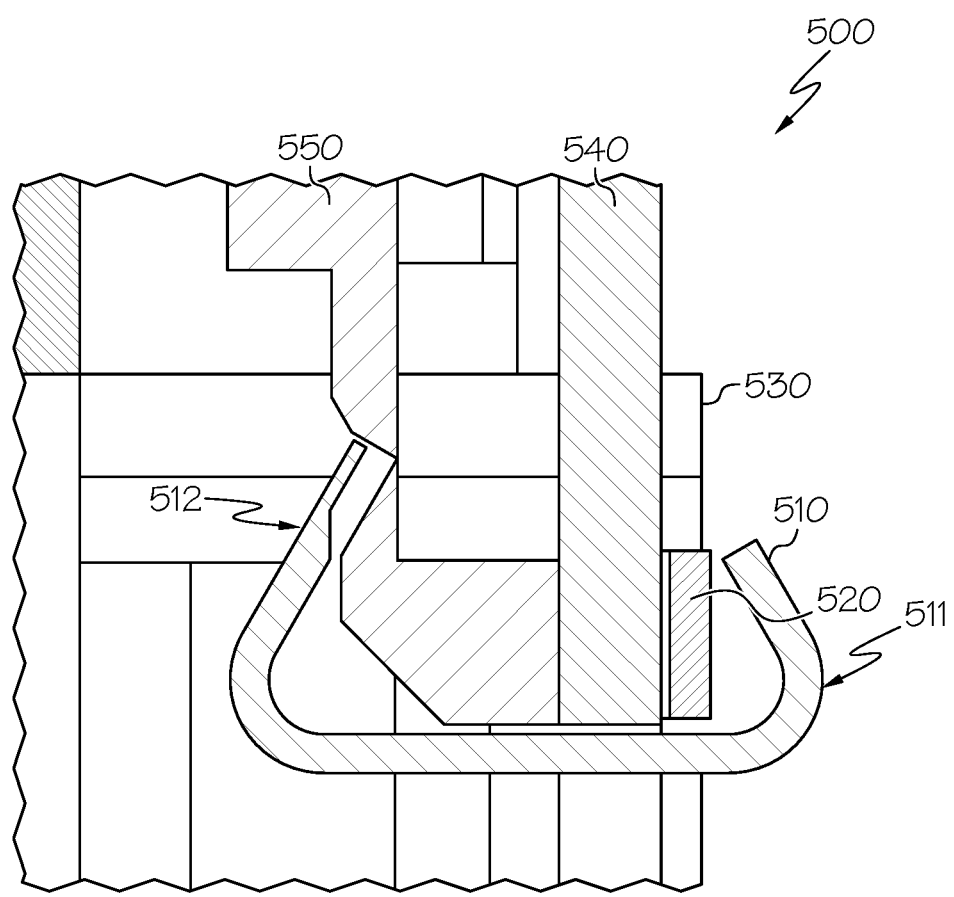
FIG. 5 is a cross sectional view of a fastener arrangement of an integrated controller according to exemplary embodiments of the present disclosure.

Turning now to FIG. 5, additional embodiments of a cross sectional view of a fastener arrangement 500 of an integrated controller according to exemplary embodiments of the present disclosure is represented. The integrated controller may include a printed circuit board 540 and a support structure, such as a backing plate 550. The fastener arrangement 500 may retain the printed circuit board 540 on the backing plate 550.

The printed circuit board 540 may be a somewhat flexible board with a plurality of circuit components mounted thereon. The backing plate 550 may be rigid in comparison. In some embodiments, the printed circuit board 540 and/or the backing plate 550 may be relatively flat, arcuate, and elongate, similar to the electronics package 260 shown in FIG. 2. Also, in some embodiments, the printed circuit board 540 and/or the backing plate 550 may extend at least partly about the axis of rotation 104 within the integrated controller. The printed circuit board 540 may overlap the backing plate 550 in some embodiments.

The fastener arrangement 500 may include at least one resilient member, such as a spring clip 510. In some embodiments, the fastener arrangement 500 may include a plurality of resilient members, such as a plurality of spring clips 510, that are disposed in spaced relationship laterally across the printed circuit board 540 and circumferentially about the axis 104. The spring clip 510 may be resiliently elastic and may provide a spring biasing force for biasing the printed circuit board 540 orthogonally toward the backing plate 550. Accordingly, the printed circuit board may be robustly supported on the backing plate 550. Furthermore, as will be discussed, the spring clip 510 may resiliently deflect for providing a number of advantages. For example, the resilient member may increase manufacturing efficiency and/or may resiliently deflect to accommodate thermal expansion/contraction within the assembly. Moreover, the fastener arrangement 500 may occupy relatively little space on the printed circuit board 540. As such, there may be more free space on the printed circuit board 540 for circuit components thereon.

In some embodiments, the resilient member may be and/or include a spring clip 510. In some embodiments, the spring clip 510 may include a first arm 511 and a second arm 512 that are attached and that are resiliently deflectable relative to each other, wherein the first arm 511 engages the printed circuit board 540 and the second arm 512 engages the support structure 550 to resiliently bias the printed circuit board 540 toward the support structure 550. The support structure 550 and the printed circuit board 540 may then cooperate to define a radial edge area that generally extends about the axis of rotation 104, and wherein the spring clip 510 is engaged to the printed circuit board 540 and the support structure 550 proximate the radial edge area. The radial edge area may be an outer radial edge area cooperatively defined by the support structure 550 and the printed circuit board 540.

The spring clips 510 may provide an orthogonal pressure on the printed circuit board 540 with an opposing pressure on a portion of the backing plate 550. The orthogonal pressure may be parallel to the axis 104 of FIG. 2. The backing plate 550 may include a recessed area 651 of FIG. 6 molded or milled to facilitate reception of a portion of the spring clip 520, such as on a rear portion of the backing plate 550. A boss 520 may be affixed or applied to a surface of the printed circuit board 540 such that the force applied by the spring clip 510 on the printed circuit board 540 is applied through the boss 520. The resulting orthogonal force and opposing force generated by the spring clip 510 acts in a manner to secure the printed circuit board 510 to the backing plate 550. In some exemplary embodiments, the spring clip 510 may be positioned onto the printed circuit board 540 and the backing plate 550 from an edge of the printed circuit board. The spring clip 510 advantageously consumes less printed circuit board space than a corresponding fixed fastener, thereby allowing for a higher density of circuit components on the printed circuit board 540. Moreover, the spring clip 510 may resiliently flex, allowing limited movement of the printed circuit board 540 relative to the backing plate 550. For example, the spring clip 510 may resiliently flex to account for and allow thermal expansion of one or more integrated controller components during operation. Moreover, the spring clips 510 may facilitate assembly by reducing assembly time, by reducing part count, etc. Specifically, to attach the printed circuit board 540 to the backing plate 550, the spring clip 510 may be advanced over the outer radial edge FIG. 6, 611, 612. As the spring clip 510 advances, the spring clip 510 may resiliently flex open. Then, as the first arm 511 and the second arm 512 move into the position shown in FIG. 5, the spring clip 510 may resiliently recover. Once in the position shown in FIG. 5, the resiliency of the spring clip 510 may bias the printed circuit board 540 toward the backing plate 550 and secure the printed circuit board 540 thereon.

A boss 520 may be affixed or applied to a surface of the printed circuit board 540 such that the force applied by the spring clip 510 on the printed circuit board 540 is applied through the boss 520. The boss 520 may be a metallic structure soldered to the printed circuit board 540 and may be electrically coupled to a ground plane of the printed circuit board 540. Alternatively, the boss 520 may be electrically isolated from components on the printed circuit board 540 to reduce thermal conduction from the backing plate 550 and other components of the integrated controller. The boss 520 may include a ramp surface that is sloped relative to the surrounding area. The ramp surface may gradually flex the spring clip 510 open as it advances over the boss 520 to aid in installation of the spring clip 510 as well as to help retain the spring clip 510 in position after installation.

A guide pin 530 may be provided to help in positioning the printed circuit board 540 on the backing plate 550 and prevent creep of the printed circuit board 540 with respect to the backing plate 550. The guide pin 530 may be rigidly affixed to the backing plate 550 and located in a corresponding aperture in the printed circuit board 540. The aperture in the printed circuit board 540 may be large enough to permit lateral movement of the printed circuit board 540 due to thermal expansion and contraction of the backing plate 550 but small enough to limit accumulated lateral movement, or creep, over multiple thermal cycles.

Figure 6:
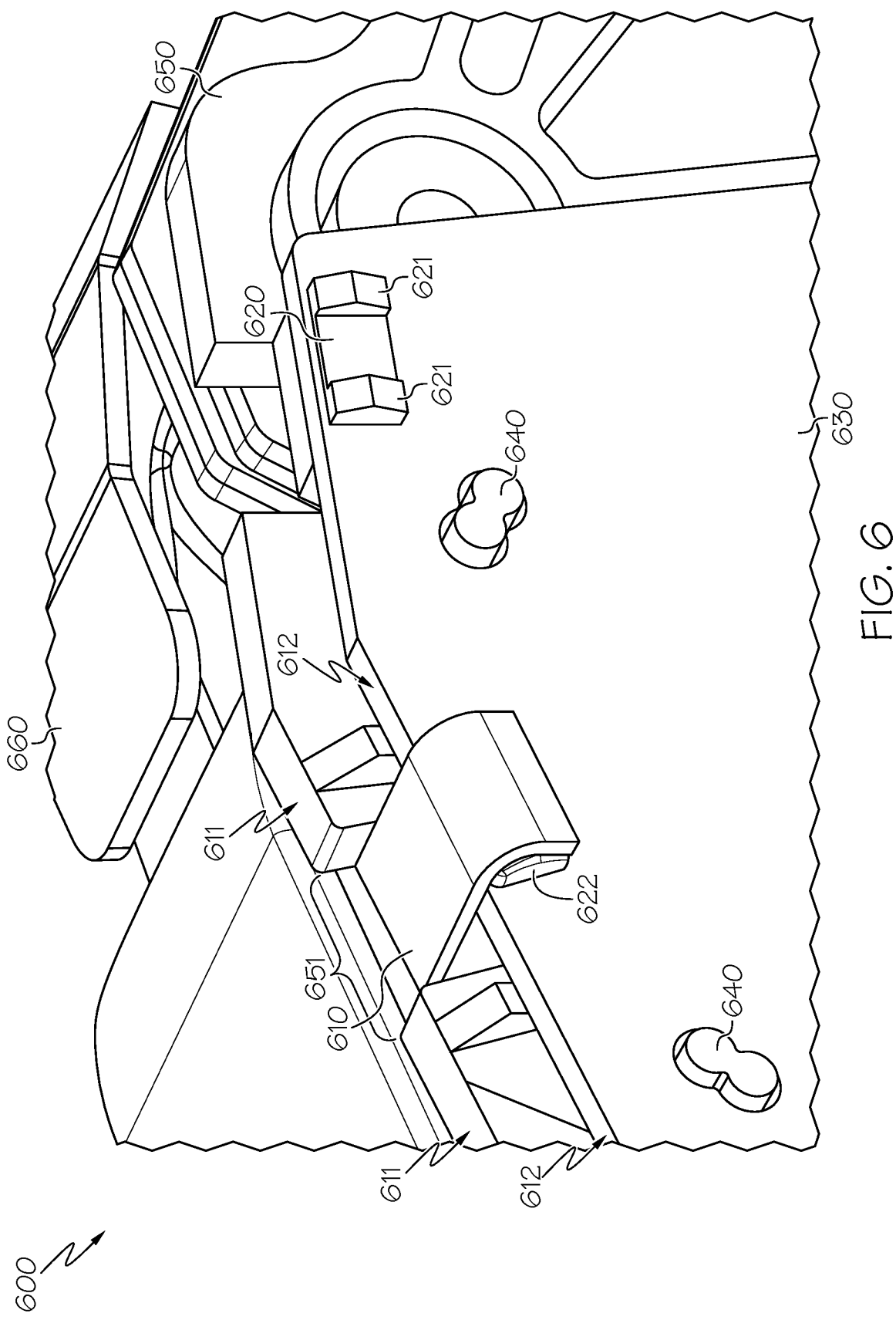
FIG. 6 is a view of a fastener arrangement of an integrated controller according to additional exemplary embodiments of the present disclosure.

Turning now to FIG. 6, additional embodiments of a fastener arrangement 600 of an integrated controller according to exemplary embodiments of the present disclosure is represented. The fastener arrangement 600 may include a spring clip 610, a support structure 660, a boss 620, a backing plate 650, guide pins 640 and a printed circuit board 630.

An exemplary boss 620 is shown, which may include a metal structure formed on a surface of the printed circuit board 630. In this exemplary embodiment, a corresponding spring clip for the exemplary boss 620 location is omitted for clarity. The exemplary boss 620 may be electrically isolated from a ground plane and other components integrated into the printed circuit board 630. The exemplary boss 620 may include raised portions 621 corresponding to an interior surface of a corresponding spring clip 610. These raised portions 621 may be used to retain the spring clip 610 in position and to prevent detachment the spring clip 610 due to creep. These raised portions 621 may be shaped as a ramp to aid in installation of the sprint clip 610 as well as to help retain the spring clip 610 in position after installation.

A spring clip 610 is shown positioned on the outer radial edge 611 of the backing plate 650 and the outer radial edge 612 of the printed circuit board 630. The spring clip 610 may engage a boss 622, which is affixed to a surface of the printed circuit board 630 while engaging a portion of the backing plate 650. In some exemplary embodiments, the spring clip 610 may be positioned within a recessed portion 651 on the outer radial edge 611 of the backing plate 650 to further reduce creep and disengagement of the spring clip 610. In some embodiments, the recessed portion 651 may be a notch in one or more of the backing plate 650 and the printed circuit board 630.

Guide pins 640 may be affixed to the backing plate 650 and/or support structure 660. Apertures within the printed circuit board 630 may be positioned such that the guide pins 640 protrude through the printed circuit board 630. These guide pins 640 may be dimensioned such that limited lateral movement of the printed circuit board 630 is permitted while preventing accumulated lateral movement, or creep, of the printed circuit board 630.

Figure 7:
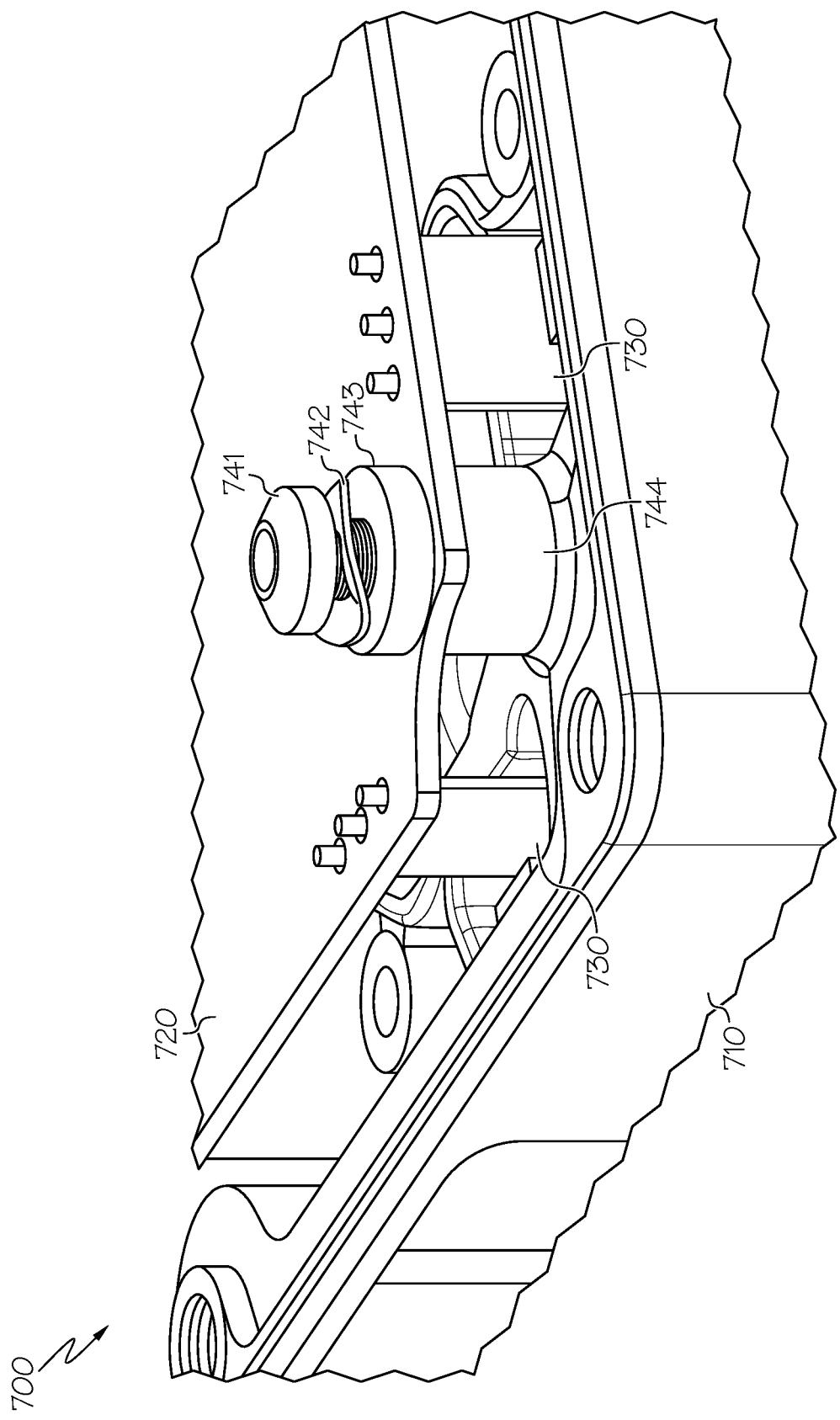
FIG. 7 is a view of a fastener arrangement of an integrated controller according to further exemplary embodiments of the present disclosure.

Turning now to FIG. 7, additional embodiments of a cross sectional view of a fastener arrangement 700 of an integrated controller according to exemplary embodiments of the present disclosure is represented. In some exemplary embodiments, a printed circuit board 720 may be affixed to a support structure 710 using the fastener arrangement 700. The fastener arrangement 700 may include a resilient member, such as a resilient washer 742, as will be discussed. Thus, the fastener arrangement 700 may allow resilient deflection of the printed circuit board 720 relative the support structure 710. Accordingly, the fastener arrangement 700 may provide robust support, but may allow for some thermal expansion of parts.

In some embodiments, the fastener arrangement 700 may include a fastener stack that includes a standoff 744, a rigid washer 743, and a bolt 741. The stack may also include a resilient member, such as a resilient washer 742. The bolt 741 may have a threaded portion for engaging a threaded cavity (not shown) in the support structure 710. One or more bus bars 730 may be electrically coupled to the printed circuit board 720 as well. The bus bar 730 may be soldered to the printed circuit board 720 in some embodiments. Thermal expansion and contraction of the bus bars 730 may result in movement of the printed circuit board 720 relative to the support structure 710. To accommodate this movement, the printed circuit board 720 may be spaced from the support structure 710 by one or more spacers 744. The printed circuit board 720 may be positioned between the spacers 744 and one or more rigid washers 743. Also, a resilient washer 472, such as a spring washer, a Belleville washer, or rubber grommet, may be positioned over the rigid washer 742 such that a head of the bolt 741 applies pressure to the resilient washer 742 as the bolt 741 is tightened into the threaded cavity of the support structure 710. The spacer 744, printed circuit board 720, fixed washer 743 and resilient washer 742 each include a corresponding hole such that the bolt 741 may be run through the aligned holes orthogonally to a plane of the printed circuit board 720 and into the threaded cavity within the support structure 710. The resilient washer 742 may be configured in a manner to provide a sufficient force on the fixed washer 743 to retain the printed circuit board 720 on the support structure 710. However, the resilient washer 742 may resiliently flex (e.g., from the wavy position shown toward a flat position) in response to thermal expansion of the bus bar 730, and the resilient washer 742 may recover in an opposite direction (e.g., from the flat position toward the wavy position shown) in response to thermal contraction of the bus bar 720 and/or other components. The bolt 741 may prevent excessive creep of the printed circuit board 720 by limiting the lateral movement of the printed circuit board 720 to the dimensions of the hole within the printed circuit board 720 which the bolt 741 passes through.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the present disclosure in any way. Rather, the foregoing detailed description will provide those skilled in the art with a convenient road map for implementing an exemplary embodiment of the present disclosure. It is understood that various changes may be made in the function and arrangement of elements described in an exemplary embodiment without departing from the scope of the present disclosure as set forth in the appended claims.

What is claimed is:

1. A controller for an e-machine of a turbomachine comprising:
    a support structure;
    a printed circuit board;
    a fastener arrangement that retains the printed circuit board on the support structure, the fastener arrangement including a resilient member that resiliently biases the printed circuit board towards the support structure; and
    a bus bar configured for carrying an electrical current, the bus bar being attached to the printed circuit board, the resilient member configured to resiliently deflect to maintain attachment of the bus bar to the printed circuit board during thermal expansion of the bus bar.

2. The controller of claim 1 wherein the resilient member is a spring clip with a first arm and a second arm that are attached and that are resiliently deflectable relative to each other, wherein the first arm engages the printed circuit board and the second arm engages the support structure to resiliently bias the printed circuit board toward the support structure.

3. The controller of claim 2, wherein the turbomachine includes a rotating group that is supported about an axis of rotation, wherein the support structure and the printed circuit board cooperate to define a radial edge area that generally extends about the axis of rotation, and wherein the spring clip is engaged to the printed circuit board and the support structure proximate the radial edge area.

4. The controller of claim 3, wherein the radial edge area is an outer radial edge area cooperatively defined by the support structure and the printed circuit board.

5. The controller of claim 2 further including a boss affixed to a surface of one of the printed circuit board and the support structure, wherein the spring clip engages the boss to retain the printed circuit board on the support structure.

6. The controller of claim 5, wherein the boss includes at least one ramp surface.

7. The controller of claim 2 further including a guide pin rigidly affixed to the support structure and passing through an aperture in the printed circuit board such that lateral movement of the printed circuit board relative to the support structure is restricted.

8. The controller of claim 2 wherein the support structure includes a notch for receiving the spring clip and wherein the notch restricts lateral movement of the spring clip.

9. The controller of claim 1 wherein at least one portion of the bus bar is soldered to the printed circuit board.

10. The controller of claim 1, wherein the fastener arrangement includes a fastener stack that fastens the printed circuit board to the support structure, the fastener stack including the resilient member, wherein the resilient member is a resilient washer.

11. A method of manufacturing a controller of an e-machine of a turbomachine comprising:
    providing a support structure;
    providing a printed circuit board;
    attaching the printed circuit board to the support structure with a fastener arrangement wherein the fastener arrangement includes a resilient member that resiliently biases the printed circuit board towards the support structure; and
    providing a bus bar configured for carrying an electrical current, and including attaching the bus bar to the printed circuit board, the resilient member configured to resiliently deflect to maintain attachment of the bus bar to the printed circuit board during thermal expansion of the bus bar.

12. The method of manufacturing of claim 11 wherein the resilient member is a spring clip with a first arm and a second arm that are attached and that are resiliently deflectable relative to each other, wherein the first arm engages the printed circuit board and the second arm engages the support structure to resiliently bias the printed circuit board toward the support structure.

13. The method of manufacturing of claim 12, wherein the turbomachine includes a rotating group that is supported about an axis of rotation, wherein the support structure and the printed circuit board cooperate to define a radial edge area that generally extends about the axis of rotation, and wherein the spring clip is engaged to the printed circuit board and the support structure proximate the radial edge area.

14. The method of manufacturing of claim 13, wherein the radial edge area is an outer radial edge area cooperatively defined by the support structure and the printed circuit board.

15. The method of manufacturing of claim 12, wherein attaching the printed circuit board includes attaching the printed circuit board via a boss affixed to a surface of one of the printed circuit board and the support structure, wherein the spring clip engages the boss to retain the printed circuit board on the support structure.

16. The method of manufacturing of claim 15, wherein the boss includes at least one ramp surface.

17. The method of manufacturing of claim 12, further including receiving a guide pin that is rigidly affixed to the support structure through an aperture in the printed circuit board such that lateral movement of the printed circuit board relative to the support structure is restricted.

18. A turbocharger having an integrated controller comprising:

a support structure including a notch for receiving a spring clip and wherein the notch restricts lateral movement of the spring clip;

a printed circuit board;

a fastener arrangement that retains the printed circuit board on the support structure, the fastener arrangement including the spring clip to resiliently bias the printed circuit board towards the support structure, wherein the spring clip includes a first arm and a second arm that are attached and that are resiliently deflectable relative to each other, wherein the first arm engages the printed circuit board and the second arm engages the support structure to resiliently bias the printed circuit board toward the support structure;

a boss affixed to a surface of one of the printed circuit board and the support structure, wherein the spring clip engages the boss to retain the printed circuit board on the support structure; and a guide pin rigidly affixed to the support structure and passing through an aperture in the printed circuit board such that lateral movement of the printed circuit board relative to the support structure is restricted.

* * * * *